US012447800B2

(12) United States Patent
Oh et al.

(10) Patent No.: US 12,447,800 B2
(45) Date of Patent: Oct. 21, 2025

(54) INTEGRATED THERMAL MANAGEMENT SYSTEM

(71) Applicants: HYUNDAI MOTOR COMPANY, Seoul (KR); KIA CORPORATION, Seoul (KR)

(72) Inventors: Man Ju Oh, Yongin-si (KR); Ki Mok Kim, Busan (KR); Sang Shin Lee, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 207 days.

(21) Appl. No.: 18/219,053

(22) Filed: Jul. 6, 2023

(65) Prior Publication Data

US 2024/0270049 A1 Aug. 15, 2024

(30) Foreign Application Priority Data

Feb. 14, 2023 (KR) ........................ 10-2023-0019456

(51) Int. Cl.
*B60H 1/00* (2006.01)
*H05K 7/20* (2006.01)
(52) U.S. Cl.
CPC ..... *B60H 1/00914* (2013.01); *B60H 1/00278* (2013.01); *H05K 7/20945* (2013.01); *B60H 2001/00307* (2013.01)

(58) Field of Classification Search
CPC ............ B60H 1/00914; B60H 1/00278; B60H 2001/00307; H05K 7/20945
USPC ........................................................ 165/202
See application file for complete search history.

(56) References Cited

U.S. PATENT DOCUMENTS

| 10,634,402 | B2 | 4/2020 | Kim |
| 2017/0158081 | A1 | 6/2017 | Kim et al. |
| 2019/0145675 | A1 | 5/2019 | Kim |

FOREIGN PATENT DOCUMENTS

| CN | 213007493 U | * | 4/2021 |
| CN | 114435075 A | * | 5/2022 |
| KR | 101855759 B1 | | 5/2018 |
| KR | 20190053487 A | | 5/2019 |
| KR | 20200038608 A | | 4/2020 |

* cited by examiner

*Primary Examiner* — Davis D Hwu
(74) *Attorney, Agent, or Firm* — Lempia Summerfield Katz LLC

(57) ABSTRACT

Proposed is an integrated thermal management system of which the cooling performance is secured because the entire area of a radiator is used when cooling a PE part and a battery. In particular, heat of the PE part and heat of the battery are selectively shared and thus the entire circuit of the system becomes compact and the energy efficiency is improved.

16 Claims, 11 Drawing Sheets

INTEGRATED THERMAL MANAGEMENT SYSTEM

CROSS REFERENCE TO RELATED APPLICATIONS

The present application claims priority to Korean Patent Application No. 10-2023-0019456, filed Feb. 14, 2023, the entire contents of which are incorporated herein for all purposes by reference.

BACKGROUND

1. Technical Field

The present disclosure relates to an integrated thermal management system to improve the cooling performance when cooling a power electronics (PE) part and a battery.

2. Description of the Related Art

Recently, electric vehicles have emerged as a social issue associated with the implementation of eco-friendly technologies and solutions for problems such as energy exhaustion. An electric vehicle is driven by a motor that is supplied with electricity from a battery and outputs driving power. Accordingly, an electric vehicle that uses a motor has several advantages, including producing no carbon dioxide emissions, generating minimal noise, and having higher energy efficiency than a vehicle that uses an internal combustion engine, so it has been spotlighted as an eco-friendly vehicle.

The core technology for achieving such an electric vehicle is the technology related to a battery module, and recently, studies for reducing the weight and size of a battery and decreasing the charge time are being actively conducted. A battery module cannot maintain optimal performance and a long lifespan unless it is used in an optimal temperature environment. However, it is substantially difficult to use a battery module in an optimal temperature environment due to heat that is generated in operation and a change of external temperature.

Further, unlike internal combustion engines, which generate waste heat through combustion, electric vehicles have no such heat source. Thus, the interior of the electric vehicles is heated by an electric heating device in wintertime. Further, warming-up is required to improve the battery charge/discharge performance in an intense cold period, so a separate cooling water heating-type electric heater is used. In other words, a technology of operating a heating/cooling system for controlling the temperature of a battery module separately from a heating/cooling system for interior air-conditioning of a vehicle in order to maintain an optimal temperature environment for the battery module is used.

In this case, a heat pump technology for minimizing consumption of heating energy applied to the air-conditioning system for interior air-conditioning of a vehicle to increase the mileage, whereby energy consumption is minimized.

However, in the related art, a radiator for cooling a PE part and a radiator for cooling a battery are separately configured, and when one radiator is applied, a partition is applied in the radiator to divide the heat exchange area of the radiator.

However, when the heat exchange area of a radiator is divided, only any one of the divided areas is used to cool only a PE part and only the other one area is used to cool only a battery is cooled, so a portion of the entire area of the radiator is not used, which is inefficient. Further, the heat exchange area of the radiator decreases, which results in deterioration of the heat exchange performance.

The description provided above as a related art of the present disclosure is just for helping understand the background of the present disclosure and should not be construed as being included in the related art known by those having ordinary skill in the art.

SUMMARY

An objective of the present disclosure is to provide an integrated thermal management system of which the cooling performance is secured because the entire area of a radiator is used when cooling a PE part and a battery. In addition, the integrated thermal management system selectively shares the heat generated by the PE part and the battery and implements a heat pumping process such that the entire circuit of the integrated thermal management system becomes compact.

In order to achieve the objectives of the present disclosure, there is provided an integrated thermal management system including: a refrigerant circuit including a compressor, an indoor heat exchanger, an outdoor heat exchanger, an expansion valve, and an evaporator. The refrigerant circuit contains a refrigerant that circulates therein. The integrated thermal management system further includes: a cooling water circuit including a first cooling water line including a PE part, a second cooling water line including a battery, and a third cooling water line connected to the first cooling water line and the second cooling water line and including a radiator. The cooling water circuit contains cooling water that circulate therein. The integrated thermal management system further includes: an integrated heat exchanger connected to the refrigerant circuit, the first cooling water line, and the second cooling water line such that the refrigerant and cooling water exchange heat with each other. The integrated thermal management system further includes: a first valve disposed in the first cooling water line such that cooling water circulating to the PE part selectively flows to the radiator or the integrated heat exchanger; and a second valve disposed in the second cooling water line such that cooling water circulating to the battery selectively flows to the radiator or the integrated heat exchanger.

The cooling water circuit may further include a fourth cooling water line connected to the first cooling water line and the second cooling water line and including a reservoir.

A first water pump may be disposed in the first cooling water line, a second water pump may be disposed in the second cooling water line, and the fourth cooling water line may be connected to a front end of the first water pump of the first cooling water line and a front end of the second water pump of the second cooling water line.

A front end of the third cooling water line may be connected to a rear end of the PE part of the first cooling water line and a rear end of the integrated heat exchanger in the second cooling water line, and a rear end of the third cooling water line may be connected to a front end of the first valve of the first cooling water line and a front end of the second valve of the second cooling water line.

The refrigerant circuit may include: a first refrigerant line including the compressor, the indoor heat exchanger, a first expansion valve, the outdoor heat exchanger, a second expansion valve, and the evaporator; a second refrigerant line diverging from a front end of the integrated heat exchanger of the first refrigerant line through a switch valve and connected to a front end of the compressor; and a third refrigerant line diverging through a third expansion valve between the switch valve of the second refrigerant line and the integrated heat exchanger and connected to the first refrigerant line.

The integrated thermal management system may further include a controller configured to control the compressor and the valves in accordance with an air-conditioning mode and a thermal management mode.

The controller may control the first valve and the second valve such that cooling water circulates to the radiator through the first cooling water line and the third cooling water line in order to cool the PE part and such that cooling water circulates to the integrated heat exchanger in the first cooling water line in order to increase and maintain temperature of the PE part.

The controller may control the first valve and the second valve such that cooling water circulates to the radiator through the second cooling water line and the third cooling water line in order to cool the battery and such that cooling water circulates to the battery in the second cooling water line in order to increase and maintain temperature of the battery.

The controller may control the first valve and the second valve such that cooling water that has passed through the PE part circulates to the battery in the first cooling water line and the second cooling water line in order to increase temperature of the battery using heat of the PE part.

The controller may control the first valve and the second valve such that cooling water that has passed through the battery circulates to the PE part in the first cooling water line and the second cooling water line in order to increase temperature of the PE part using heat of the battery.

In order to implement interior cooling or heat pumping process, the second expansion valve and the third expansion valve may be operated for expansion and the controller may control the switch valve and the third expansion valve such that the refrigerant, which has passed through the compressor, the indoor heat exchanger, the first expansion valve, and the outdoor heat exchange valve, circulates to the evaporator and the integrated heat exchanger in the refrigerant circuit.

In order to implement interior heating or heat pumping process via external air heat absorption, the first expansion valve may be operated for expansion, the second expansion valve may be closed, and the controller may control the switch valve such that the refrigerant, which has passed through the compressor, the indoor heat exchanger, and the first expansion valve, absorbs heat through the outdoor heat exchanger and then circulates to the compressor in the refrigerant circuit.

In order to implement a heat pumping process via heat absorption of the PE part or the battery, the first expansion valve may be operated for expansion, the second expansion valve may be closed, the third expansion valve may be opened, and the controller may control the switch valve such that the refrigerant, which has passed through the compressor, the indoor heat exchanger, and the first expansion valve, absorbs heat through the outdoor heat exchanger and the integrated heat exchanger and then circulates to the compressor in the refrigerant circuit, and may control the first valve or the second valve such that cooling water circulates to the integrated heat exchanger in the first cooling water line or the second cooling water line.

In order to implement dehumidification, the first expansion valve may be closed, the second expansion valve may be operated for expansion, and the controller may control the switch valve and the third expansion valve such that the refrigerant flows to the compressor, the indoor heat exchanger, the second expansion valve, and the evaporator in the refrigerant circuit.

In order to implement a heat pumping process via external air heat absorption during interior dehumidification, the first expansion valve may be operated for expansion, the second expansion valve may be opened, and the controller may control the switch valve such that the refrigerant flows to the compressor, the indoor heat exchanger, the first expansion valve, the outdoor heat exchanger, and the evaporator in the refrigerant circuit.

The radiator may be configured such that an entire area thereof is an available area.

According to the integrated thermal management system having the structure described above, the entire area of the radiator is used to cool the PE part or the battery, so cooling performance is secured, the heat of the PE part and the heat of the battery are selectively shared, and a heat pumping process is implemented, whereby energy efficiency is improved and the entire circuit is implemented in a compact size.

DETAILED DESCRIPTION

Figure 1:
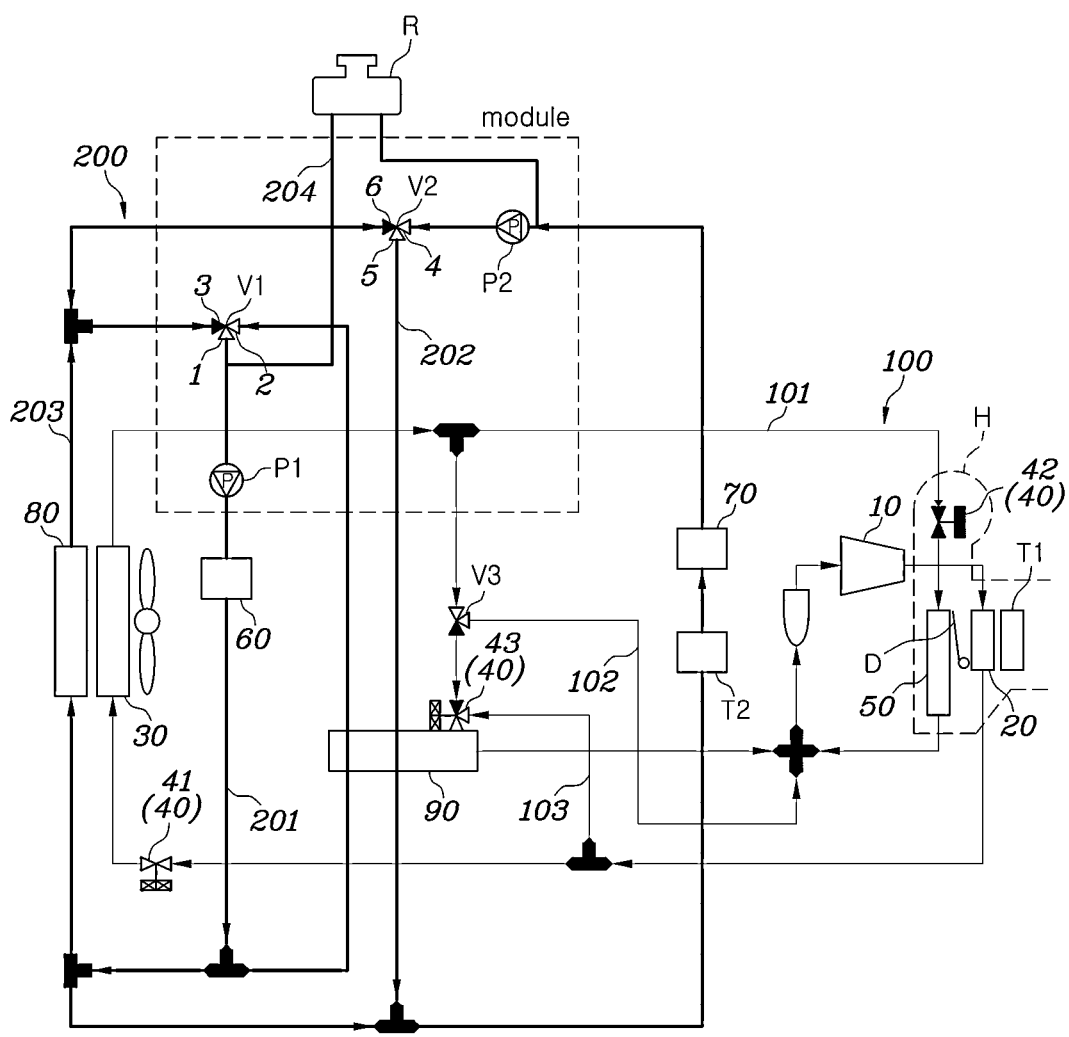
FIG. 1 illustrates an integrated thermal management system according to an embodiment of the present disclosure.

Hereafter, embodiments of the present disclosure are described in detail with reference to the accompanying drawings and the same or similar components are given the same reference numerals regardless of the numbers of figures and are not repeatedly described.

Terms "module" and "unit" that used for components in the following description are used only for the convenience of description without having discriminate meanings or functions.

In the following description, if it is decided that the detailed description of known technologies related to the present disclosure makes the subject matter of the embodiments described herein unclear, the detailed description is omitted. Further, the accompanying drawings are provided only for easy understanding of embodiments disclosed in the specification, and the technical spirit disclosed in the specification is not limited by the accompanying drawings, and all changes, equivalents, and replacements should be understood as being included in the spirit and scope of the present disclosure.

Terms including ordinal numbers such as "first", "second", etc. may be used to describe various components, but the components are not to be construed as being limited to the terms. The terms are used only to distinguish one component from another component.

It is to be understood that when one element is referred to as being "connected to" or "coupled to" another element, it may be connected directly to or coupled directly to another element or be connected to or coupled to another element, having the other element intervening therebetween. On the other hand, it should to be understood that when one element is referred to as being "connected directly to" or "coupled directly to" another element, it may be connected to or coupled to another element without the other element intervening therebetween.

Singular forms are intended to include plural forms unless the context clearly indicates otherwise.

It should be further understood that the terms "comprise" or "have" used in this specification, specify the presence of stated features, steps, operations, components, parts, or a combination thereof, but do not preclude the presence or addition of one or more other features, numerals, steps, operations, components, parts, or a combination thereof.

A controller may include a communication device that communicates with another controller or a sensor to control corresponding functions, a memory that stores an operating system or logic commands and input/output information, and one or more processors that perform determination, calculation, decision, for etc. controlling the corresponding functions.

An integrated thermal management system according to exemplary embodiments of the present disclosure is described hereafter with reference to the accompanying drawings.

Figure 2:
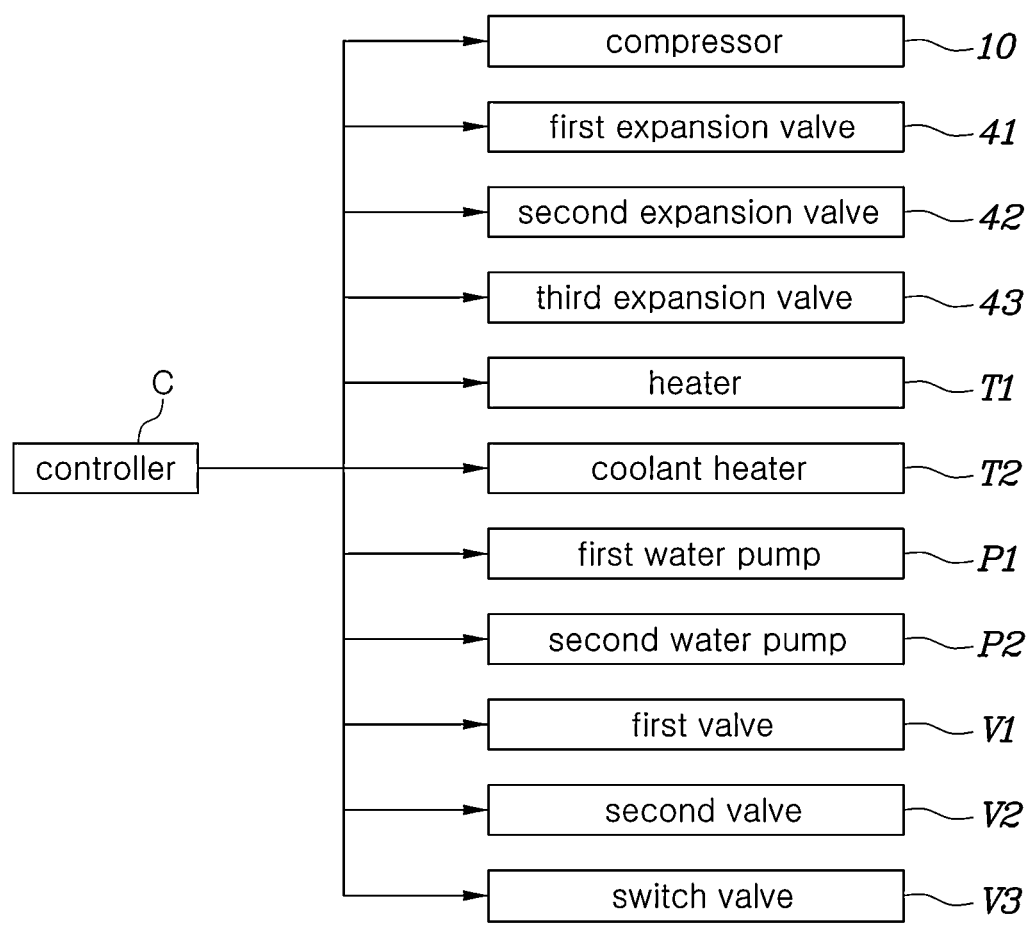
FIG. 2 is a configuration diagram of the integrated thermal management system according to an embodiment of the present disclosure.

FIG. 1 is a view showing an integrated thermal management system according to an embodiment of the present disclosure and FIG. 2 is a configuration diagram of the integrated thermal management system according to the present disclosure.

Figure 3:
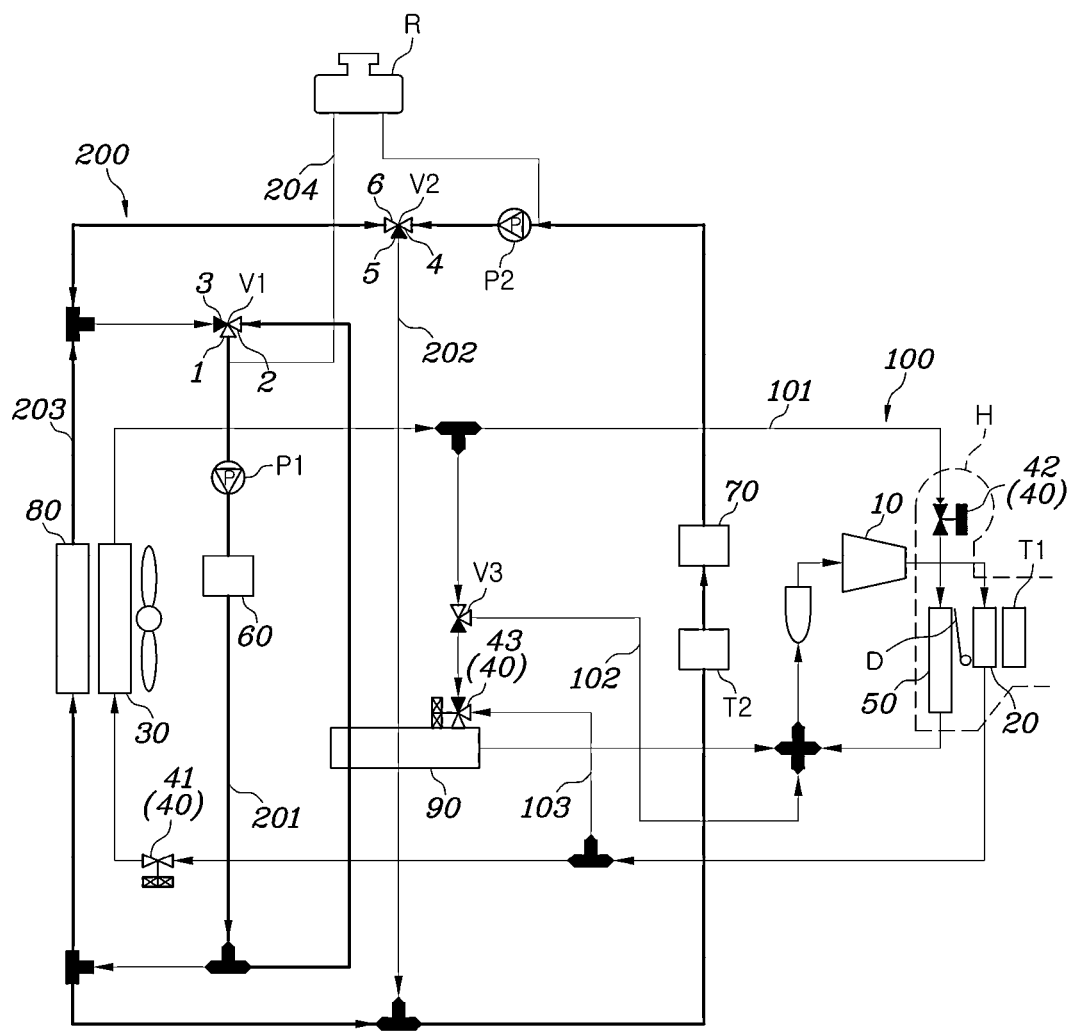
FIG. 3 is a view illustrating the temperature management of a PE part or a battery using external air according to an embodiment of the present disclosure.
Figure 4:
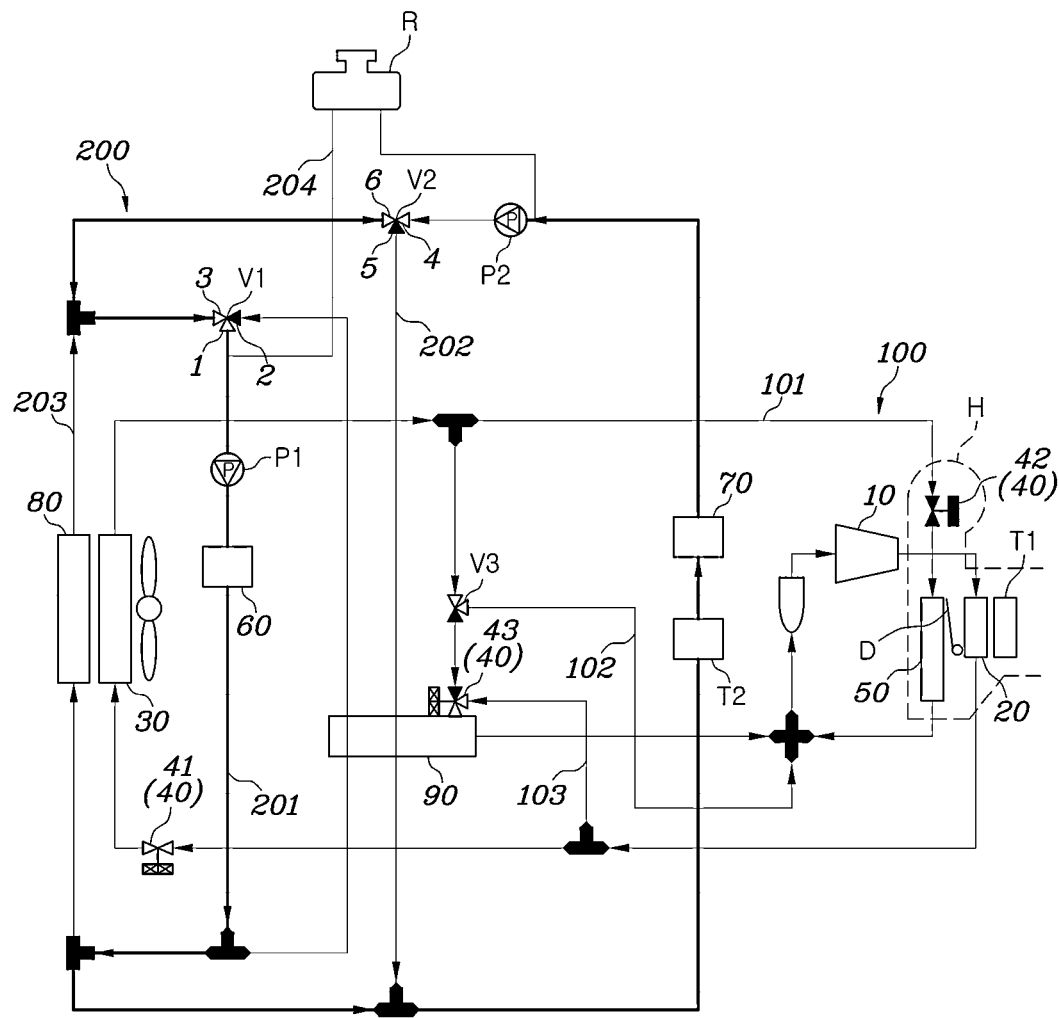
FIG. 4 is a view illustrating battery heating using heat generated by a PE part according to an embodiment of the present disclosure.
Figure 5:
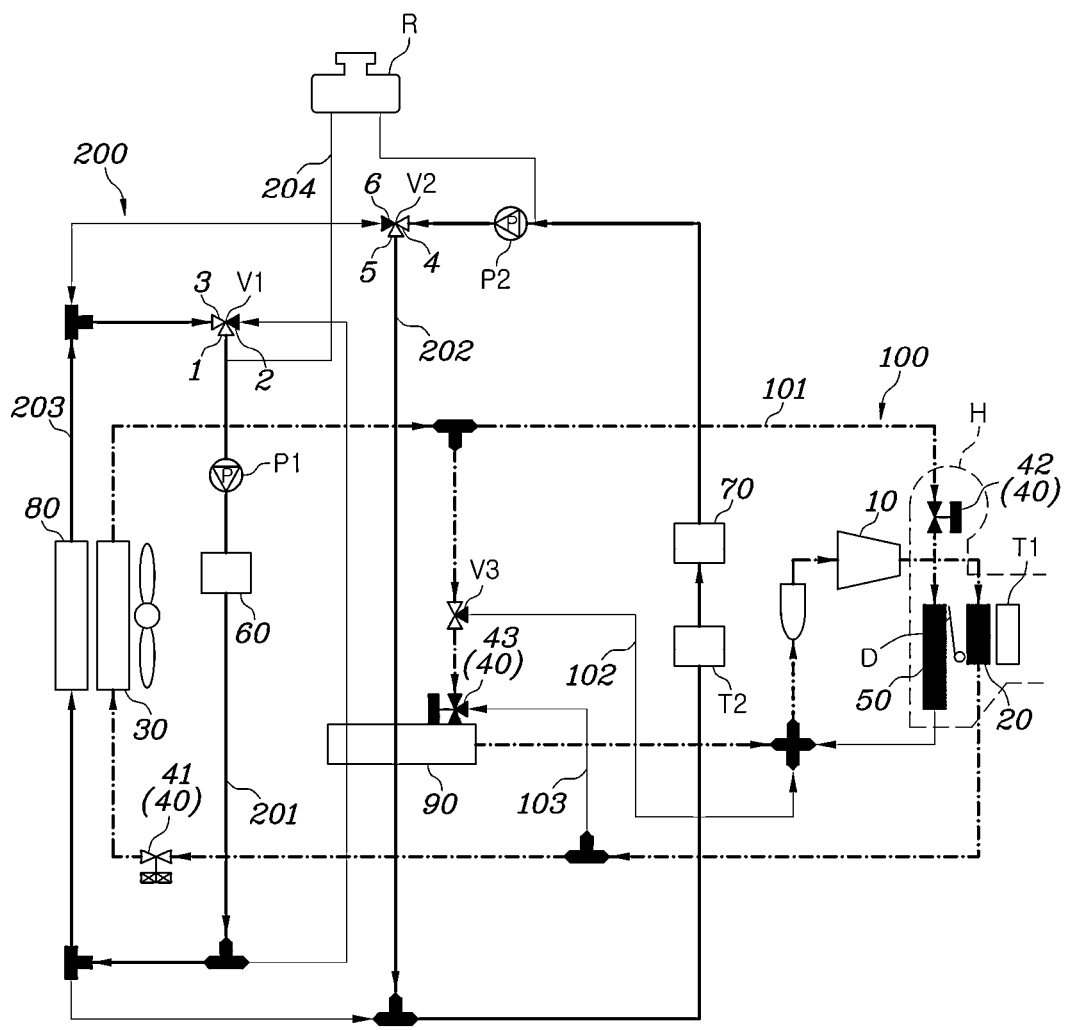
FIG. 5 is a view illustrating interior heating or a heat pumping process in one embodiment of the present disclosure.
Figure 6:
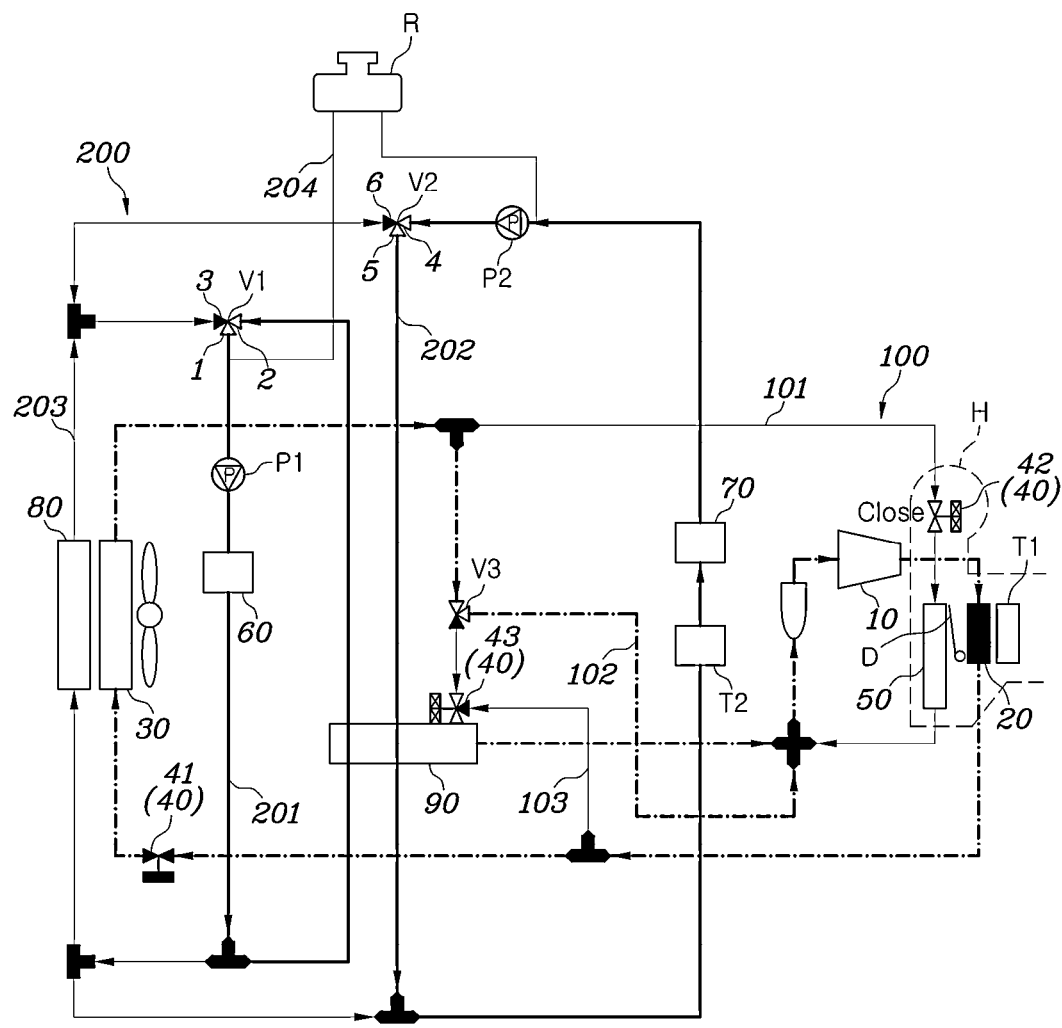
FIG. 6 is a view illustrating a heat pumping process using interior heating or external air heat absorption in one embodiment of the present disclosure.
Figure 7:
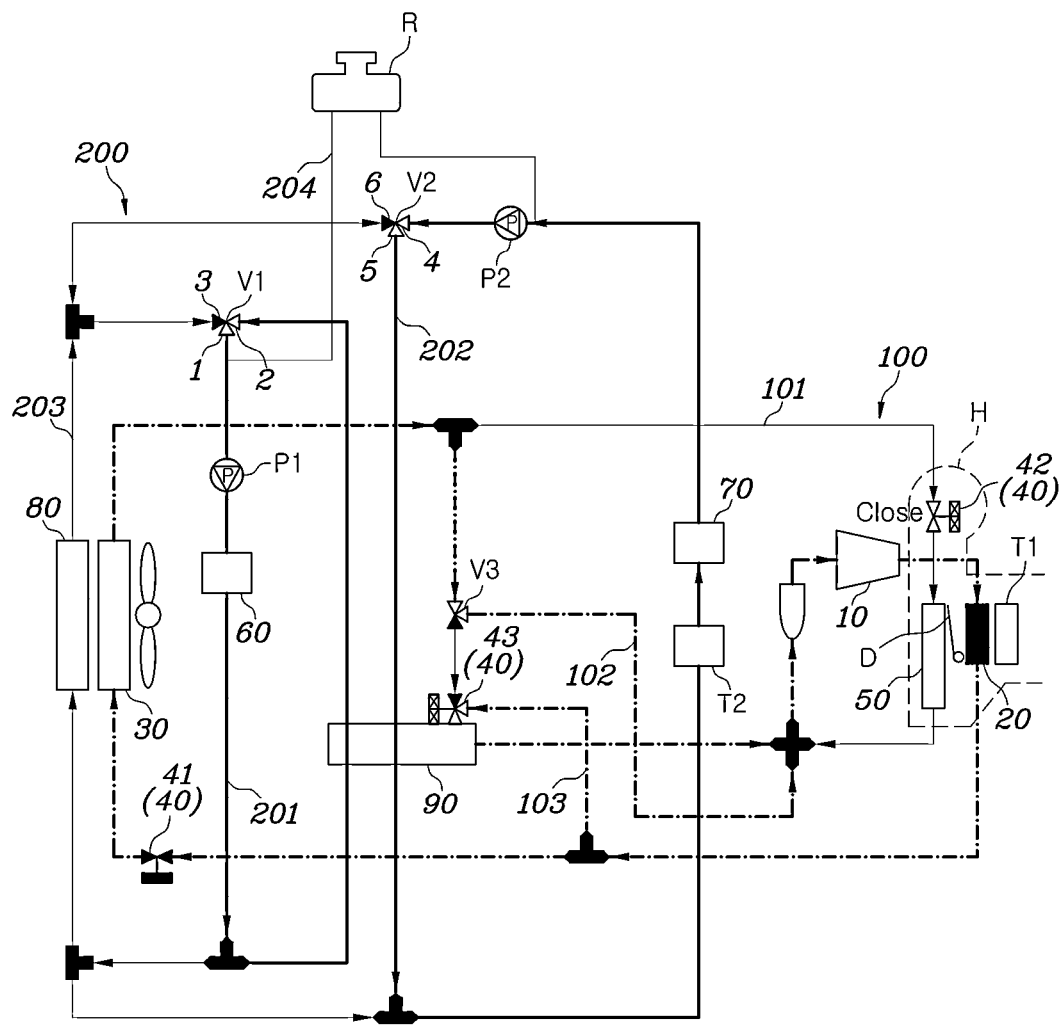
FIG. 7 is a view illustrating a heat pumping process using interior heating or battery heat absorption in one embodiment of the present disclosure.
Figure 8:
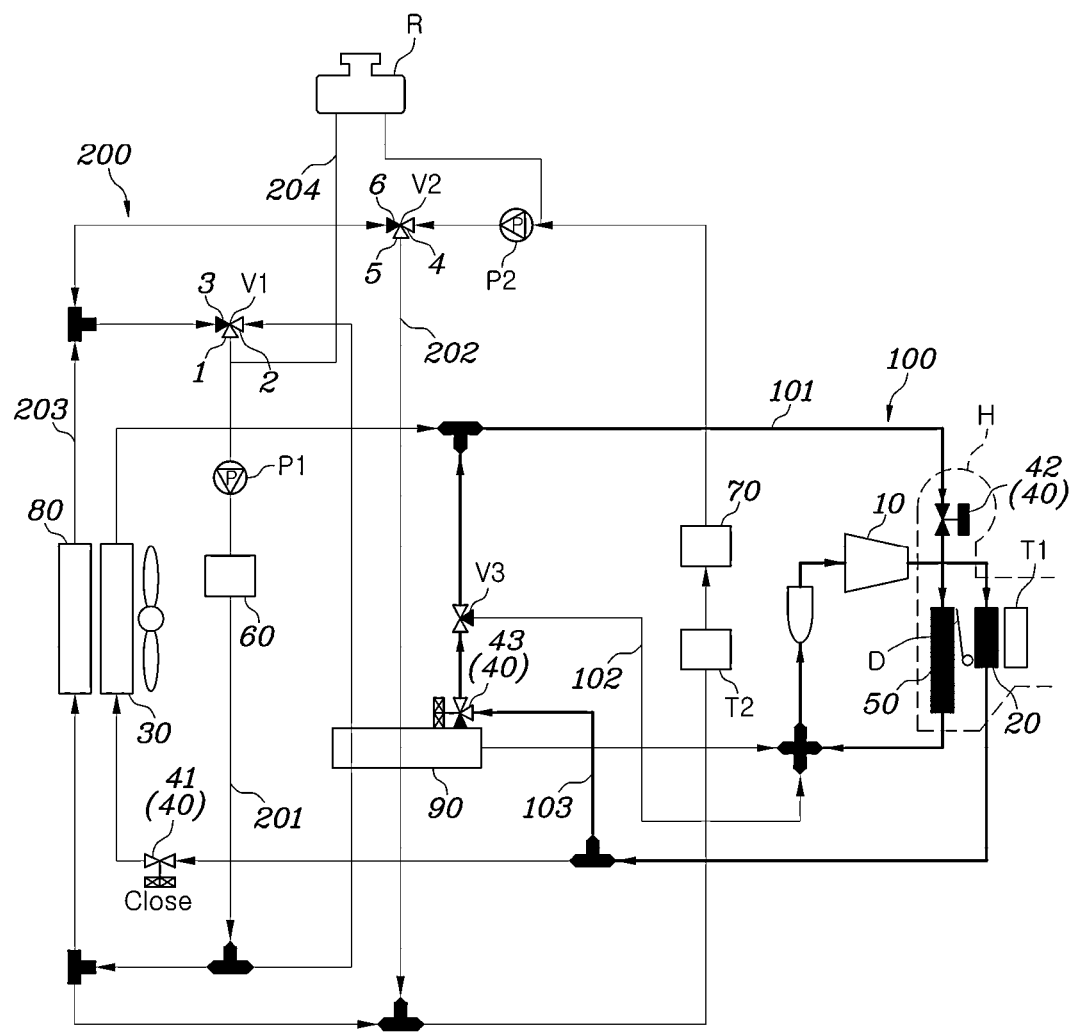
FIG. 8 is a view illustrating interior dehumidification in one embodiment of the present disclosure.
Figure 9:
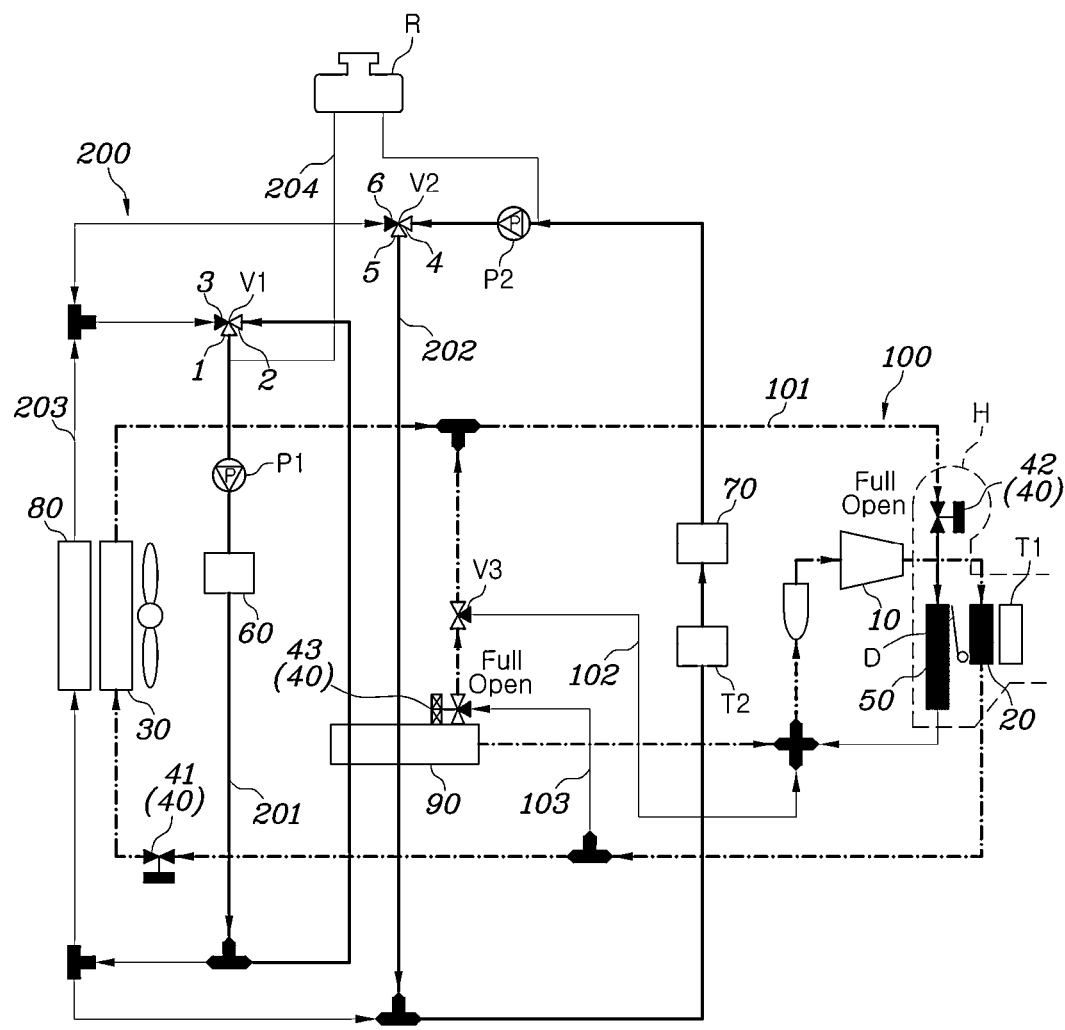
FIG. 9 is a view illustrating a heat pumping process using external air heat absorption during interior dehumidification in one embodiment of the present disclosure.
Figure 10:
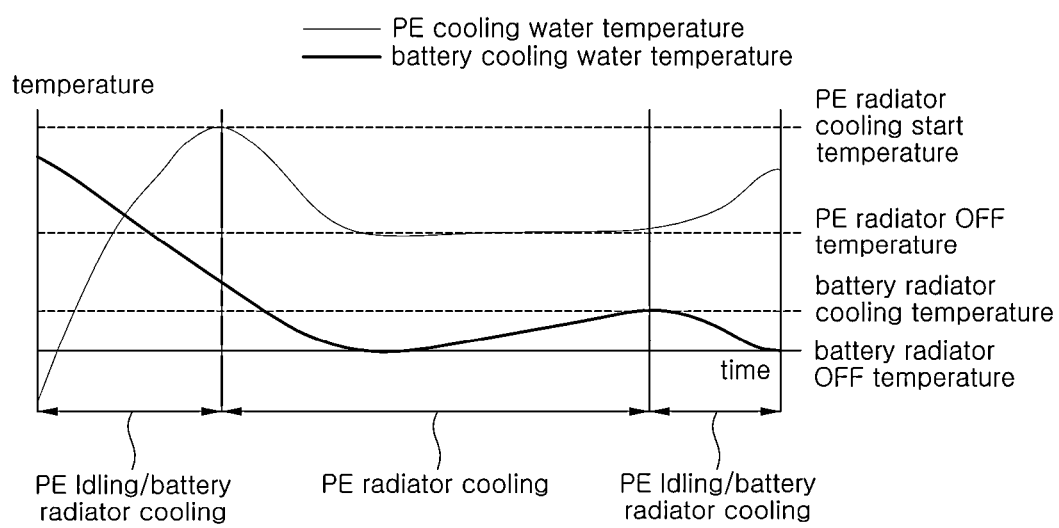
FIG. 10 is a graph illustrating the temperatures management of a PE part and a battery in an integrated thermal management system according to one embodiment of the present disclosure.
Figure 11:
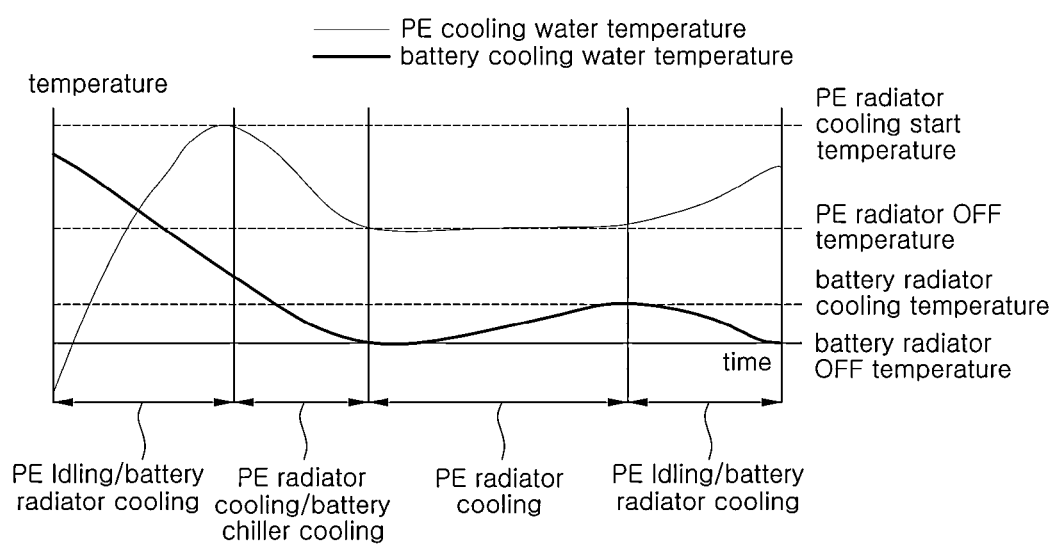
FIG. 11 is a graph illustrating the temperatures management of a PE part and a battery in an integrated thermal management system according to another embodiment of the present disclosure.

FIG. 3 is a view showing an embodiment for managing the temperatures of a PE part or a battery using external air, FIG. 4 is a view showing an embodiment for increasing the temperature of a battery using heat of a PE part, FIG. 5 is a view showing an embodiment for interior heating or heat pumping process, FIG. 6 is a view showing a heat pumping process using interior heating or external air heat absorption, FIG. 7 is a view showing a heat pumping process using interior heating or battery heat absorption, FIG. 8 is a view showing an embodiment for interior dehumidification, FIG. 9 is a view showing a heat pumping process using external air heat absorption during interior dehumidification, FIG. 10 is a view showing an embodiment for managing the temperatures of a PE part and a battery in an integrated thermal management system according to the present disclosure, and FIG. 11 is a view showing another embodiment for managing the temperatures of a PE part and a battery in an integrated thermal management system according to the present disclosure.

As shown in FIGS. 1-2, according to one embodiment of the present disclosure, an integrated thermal management system includes a refrigerant circuit 100 in which a refrigerant circulates. In particular, the refrigerant circuit 100 includes: a compressor 10, an indoor heat exchanger 20, an outdoor heat exchanger 30, an expansion valve 40, and an evaporator 50. The integrated thermal management system further includes a cooling water circuit 200 in which cooling water circulates. The cooling water circuit includes: a first cooling water line 201 including a power electronics (PE) part 60, a second cooling water line 202 including a battery 70, and a third cooling water line 203 connected to the first cooling water line 201 and the second cooling water line 202 and including a radiator 80. The integrated thermal management system also includes an integrated heat exchanger 90 that is connected to the refrigerant circuit 100, the first cooling water line 201, and the second cooling water line 202 such that the refrigerant and cooling water exchange heat with each other. The integrated thermal management system further includes a first valve V1 that is disposed in the first cooling water line 201 such that cooling water circulating to the PE part 60 selectively flows to the radiator 80 or the integrated heat exchanger 90. The integrated thermal management system further includes a second valve V2 that is disposed in the second cooling water line 202 such that cooling water circulating to the battery 70 selectively flows to the radiator 80 or the integrated heat exchanger 90.

In the refrigerant circuit 100, the refrigerant compressed by the compressor 10 flows to the indoor heat exchanger 20 or the outdoor heat exchanger 30 and exchanges heat with air and the refrigerant condensed through the indoor heat exchanger 20 or the outdoor heat exchanger 30 is expanded by the expansion valve 40 and then flows to the evaporator 50, whereby the evaporator 50 can produce cooling air through evaporation. Because a high-temperature and high-pressure refrigerant flows into the indoor heat exchanger 20 through the compressor 10, the indoor heat exchanger 20 can heat air.

The indoor heat exchanger 20 and the evaporator 50 may be disposed in an air-conditioning housing H. Further, a temperature adjustment door D that adjusts the temperature of conditioning air between the indoor heat exchanger 20 and the evaporator 50, and a heater T1 supplementing a heat source behind the indoor heat exchanger 20, depending on whether it is operated, may be provided in the air-conditioning housing H. In this case, the heater T1 may be a PTC.

In the present disclosure, the refrigerant circuit 100 may include a plurality of refrigerant lines and the refrigerant is selectively sent to each refrigerant circuit by changing the flow direction of the refrigerant to the refrigerant lines, whereby indoor cooling/heating air-conditioning can be achieved.

According to an embodiment of the present disclosure, the refrigerant circuit 100 may include: a first refrigerant line 101; a second refrigerant line 102 diverging from the front end of the integrated heat exchanger 90 of the first refrigerant line 101 through a switch valve V3; and a third refrigerant line 103 diverging through a third expansion valve 43 between the switch valve V3 of the second refrigerant line 102 and the integrated heat exchanger 90. The first refrigerant line 101 may include the compressor 10, the indoor heat exchanger 20, a first expansion valve 41, the outdoor heat exchanger 30, a second expansion valve 42, and the evaporator 50. The second refrigerant line 102 is diverged from the front end of the integrated heat exchanger 90 and connected to the front end of the compressor 10. The third refrigerant line 103 is diverged through the third expansion valve 43 between the switch valve V3 and the integrated heat exchanger 90 and connected to the first refrigerant line 101.

In this way, the refrigerant circuit 100 is configured such that the first refrigerant line 101, the second refrigerant line 102, and the third refrigerant line 103 are connected to each other, and a high-temperature and high-pressure refrigerant compressed through the compressor in the first refrigerant line 101 flows to the indoor heat exchanger 20, whereby heating air can be produced at the indoor heat exchanger 20. Further, the refrigerant can discharge heat from the outside through the outdoor heat exchanger 30 when the first expansion valve 41 opens, and can absorb heat through the outdoor heat exchanger 30 when the first expansion valve 41 is operated for expansion. Further, when the refrigerant condensed through the indoor heat exchanger 20 or the outdoor heat exchanger 30 flows through the evaporator 50 after expanding through the second expansion valve 42, heating and dehumidifying air can be produced at the evaporator 50.

The second refrigerant line 102 diverges between the outdoor heat exchanger 30 and the evaporator 50 of the first refrigerant line 101 and is connected to the front end of the compressor 10. Further, the switch valve V3 is disposed in the second refrigerant line 102, so the refrigerant can be selectively sent to the second refrigerant line 102, depending on whether the switch valve V3 opens.

The third refrigerant line 103 diverges between the indoor heat exchanger 20 and the outdoor heat exchanger 30 of the first refrigerant line 101 and is connected to the second refrigerant line 102 and the front end of the compressor 10. The integrated heat exchanger 90 is included in the third refrigerant line 103 and the third expansion valve 43 is disposed at the front end of the integrated heat exchanger 90, so the refrigerant can be selectively sent to the third refrigerant line 103, depending on whether the third expansion valve 43 opens. In this configuration, the third expansion valve 43 may have several ports to control expansion and flow of the refrigerant and may be configured to selectively expand the refrigerant that flows to the integrated heat exchanger 90 from the second refrigerant line 102.

In one embodiment, the cooling water circuit 200 may include a first cooling water line 201 including a PE part 60, a second cooling water line 202 including a battery 70 and a coolant heater T2, and a third cooling water line 203 connected to the first cooling water line 201 and the second cooling water line and including a radiator 80.

In this configuration, the radiator 80 may be configured to have an available area throughout the entire area. In other words, the radiator 80 is not divided and allows external air and cooling water to exchange heat with each other through the entire area of the radiator, so a heat exchange area can be secured and heat exchange efficiency can be improved.

In one embodiment, the first cooling water line 201 circulates cooling water such that the temperature of the PE part 60 is managed, the second cooling water line circulates cooling water such that the temperature of the battery 70 is managed, and the third cooling water line 203 circulates cooling water such that the temperature of the cooling water circulating through the first cooling water line 201 or the second cooling water line is managed.

Further, the first cooling water line 201 and the second cooling water line 202 are connected to each other such that the refrigerant circulating in the refrigerant circuit 100 and cooling water exchange heat with each other through the integrated heat exchanger.

In particular, according to one embodiment of the present disclosure, the first cooling water line 201, the second cooling water line 202, and the third cooling water line 203 are connected to each other such that cooling water can flow through them, and the circulation direction of cooling water depends on whether the first valve V1 disposed in the first cooling water line 201 and the second valve V2 disposed in the second cooling water line 202 open.

The first valve V1 is disposed in the first cooling water line 201 and selectively sends the cooling water circulating to the PE part 60 to the radiator 80 or the integrated heat exchanger 90.

Further, the second valve V2 is disposed in the second cooling water line 202 and selectively sends the cooling water circulating to the battery 70 to the radiator 80 or the integrated heat exchanger 90.

In this configuration, the front end of the third cooling water line 203 may be connected to the rear end of the PE part 60 of the first cooling water line 201 and the rear end of the integrated heat exchanger 90 in the second cooling water line 202, and the rear end thereof may be connected to the front end of the first valve V1 of the first cooling water line 201 and the front end of the second valve V2 of the second cooling water line 202.

Accordingly, in the present disclosure, not only the temperature of the cooling water circulating through each cooling water line can be managed through the radiator 80 and the integrated heat exchanger 90, but also the cooling water in the first cooling water line 201 and the cooling water in the second cooling water line 202 can join. Therefore, according to the present disclosure, a heat pumping process is implemented, and temperature is adjusted while the cooling water that manages the temperature of the PE part 60 and the cooling water that manages the temperature of the battery 70 are shared, whereby it is possible to efficiently manage the temperatures of the PE part 60 and the battery 70. In other words, because the cooling water circulating to the PE part 60 is used to adjust the temperature of the battery 70, operation of the coolant heater T2 is minimized, whereby it is possible to increase energy efficiency.

In another embodiment, the cooling water circuit 200 may further include a fourth cooling water line 240 connected to the first cooling water line 201 and the second cooling water line 202 and including a reservoir R.

In one embodiment, the reservoir R may be a single part and the fourth cooling water line 204 is connected to the first cooling water line 201 and the second cooling water line 202, so it is possible to vent the cooling water circulating through each of the cooling water lines and to secure a flow rate of the cooling water. The reservoir R has a partition therein to separate the cooling water circulating through the first cooling water line 201 and the cooling water circulating through the second cooling water line 202, whereby it is possible to the cooling water circulating through the cooling water lines is not mixed in the reservoir R.

Further, a first water pump P1 and a second water pump P2 are disposed in the first cooling water line 201 and the second cooling water line 202 to circulate cooling water.

In this configuration, the fourth cooling water line 204 is connected to the front end of the first water pump P1 of the first cooling water line 201 and the front end of the second water pump P2 of the second cooling water line, whereby the cooling water circulating through cooling water lines and the cooling water in the reservoir R can exchange well each other when the water pumps are driven.

Meanwhile, the front end of the third cooling water line 203 may be connected to the rear end of the PE part 60 of the first cooling water line 201 and the rear end of the integrated heat exchanger 90 in the second cooling water line 202, and the rear end thereof may be connected to the front end of the first valve V1 of the first cooling water line 201 and the front end of the second valve V2 of the second cooling water line 202.

In an embodiment of the present disclosure, the reservoir R, the first valve V1, the second valve V2, the first water pump P1, and the second water pump P2 may be configured in one module.

According to the present disclosure described above, it is possible to perform various air-conditioning modes and thermal management modes. To this end, a controller "C" can receive information such as the temperature of the PE part 60, the temperature of the battery 70, an interior temperature, etc., and can control the compressor 10 and the valves.

In the following description of the present disclosure, it is assumed that the first valve V1 has a first port 1 facing the PE part 60, a second port 2 facing the integrated heat exchanger 90, and a third port 3 facing the radiator 80, and the second valve V2 has a fourth port 4 facing the battery 70, a fifth port 5 facing the integrated heat exchanger 90, and a sixth port 6 facing the radiator 80.

The controller C can control the first valve V1 and the second valve V2 such that cooling water circulates to the radiator 80 through the first cooling water line 201 and the third cooling water line 203 when cooling the PE part 60 and such that cooling water circulates to the integrated heat exchanger 90 in the first cooling water line 201 when increasing and maintaining the temperature of the PE part 60.

In other words, when it is required to cool the PE part 60, the first port 1 and the third valve 3 of the first valve V1 are opened and the second port 2 is closed, so cooling water can circulate through the PE part 60 and the radiator 80 in the first cooling water line 201, whereby cooling water cooled through the radiator 80 can cool the PE part 60.

Further, when it is required to increase and maintain the temperature of the PE part 60, the first port 1 and the second port 2 of the first valve V1 are opened and the third port 3 is closed, so cooling water circulates through the PE part 60 and the integrated heat exchanger 90 in the second cooling water line 202, whereby the temperature of the cooling water can be maintained.

In one embodiment, the controller C can control the first valve V1 and the second valve V2 such that cooling water circulates to the radiator 80 through the second cooling water line and the third cooling water line 203 when cooling the battery 70 and such that cooling water circulates to the battery 70 in the second cooling water line when increasing and maintaining the temperature of the battery 70.

When it is required to cool the battery 70, the fourth port 4 and the sixth valve 6 of the second valve V2 are opened and the fifth port 5 is closed, so cooling water can circulate through the battery 70 and the radiator 80 in the second cooling water line 202, whereby cooling water cooled through the radiator 80 can be supplied to the battery 70.

Further, when it is required to increase and maintain the temperature of the battery 70, the fourth port 4 and the fifth port 5 of the second valve V2 are opened and the sixth port 6 is closed, so cooling water circulates through the battery 70 and the integrated heat exchanger 90 in the second cooling water line 202, whereby the temperature of the cooling water can be maintained.

Managing the temperatures of the PE part 60 and the battery 70 using external air is shown in FIG. 3, FIG. 3 shows the state in which the temperature of the PE part 60 is increased and maintained and the battery 70 is cooled through the radiator 80.

Meanwhile, according to the present disclosure, the cooling water circulating through the first cooling water line 201, the second cooling water line 202, and the third cooling water line 203 is shared, depending on whether the first valve V1 and the second valve V2 are opened, whereby it is possible to manage the temperature of cooling water using heat generated at the PE part 60 and heat generated at the battery 70. Further, the present disclosure uses one radiator 80 when cooling the PE part 60 and the battery 70.

In detail, as shown in FIG. 4, in order to increase the temperature of the battery 70 using the temperature of the PE part 60, the controller C can control the first valve V1 and the second valve V2 such that cooling water that has passed through the PE part 60 in the first cooling water line 201 and the second cooling water line 202 circulates to the battery 70.

In other words, in order to increase the temperature of the battery 70 using heat of the PE part 60, the first port 1 and the third port 3 of the first valve V1 can be opened and the second port 2 thereof can be closed, and the third port 3 and the fourth port 4 of the second valve V2 can be opened and the fifth port 5 thereof can be closed. Accordingly, cooling water temperature increased as it circulated through the PE part 60 in the first cooling water line 201. This water then flows to the battery 70 in the second cooling water line 202, whereby the heat of the PE part 60 can be transmitted to the battery 70. In this case, the coolant heater T2 may be selectively driven, depending on the temperature of the battery 70.

Further, in order to increase the temperature of the PE part 60 using heat of the battery 70, the controller C can control the first valve V1 and the second valve V2 such that cooling water that has passed through the battery 70 in the first cooling water line 201 and the second cooling water line 202 circulates to the PE part 60.

In other words, in order to increase the temperature of the PE part 60 using heat of the battery 70, the first port 1 and the third port 3 of the first valve V1 can be opened and the second port 2 thereof can be closed, and the third port 3 and the fourth port 4 of the second valve V2 can be opened and the fifth port 5 thereof can be closed. Accordingly, cooling water temperature increased as it circulated through the battery 70 in the second cooling water line 202. This water then flows to the PE part 60 in the first cooling water line 201, whereby the heat of the battery 70 can be transmitted to the PE part 60.

As described above, the present disclosure can mutually supply a heat source by circulating cooling water in accordance with temperature conditions of the PE part 60 and the battery 70.

Meanwhile, in order to implement interior cooling or heat pumping process, the second expansion valve 42 and the third expansion valve 43 are operated for expansion and controller C can control the switch valve V3 and the third expansion valve 43 such that the refrigerant that has passed through the compressor 10, the indoor heat exchanger 20, the first expansion valve 41, and the outdoor heat exchanger 30 circulates to the evaporator 50 and the integrated heat exchanger 90 in the refrigerant circuit 100.

In other words, when it is required to heat an interior, the second expansion valve 42 is operated for expansion and the first expansion valve is opened, so the refrigerant discharged from the compressor 10 condenses through the indoor heat exchanger 20 and the outdoor heat exchanger 30 and then expands through the second expansion valve 42, whereby conditioning air is cooled by heat absorption of the evaporator 50.

In this case, when a heat pumping process that enables the refrigerant and cooling water in the cooling water lines exchange heat with each other through the integrated heat exchanger 90 is performed, the third expansion valve 43 is operated for expansion. Accordingly, evaporation is generated at the integrated heat exchanger 90, so the cooling water circulating through the cooling water lines can be cooled through heat exchange.

It is shown in FIG. 5 that the temperature of the PE part 60 is managed using the radiator 80 and the temperature of the battery 70 is managed using the integrated heat exchanger 90.

Meanwhile, as shown in FIG. 6, in order to implement interior heating or heat pumping process via external air heat absorption, the first expansion valve 41 is operated for expansion and the second expansion valve 42 is closed, and the controller C controls the switch valve V3 such that the refrigerant that has passed through the compressor 10, the indoor heat exchanger 20, and the first expansion valve 41 absorbs heat through the outdoor heat exchanger 30 and then circulates to the compressor 10 in the refrigerant circuit 100.

In other words, when it is required to heat an interior, the first expansion valve 41 is operated for expansion and the second expansion valve 42 is closed, whereby the refrigerant discharged from the compressor 10 condenses while discharge heat through the indoor heat exchanger 20. In this case, the conditioning air that is supplied to the interior through the indoor heat exchanger 20 is heated. The refrigerant that has condensed through the indoor heat exchanger 20 is expanded by the first expansion valve 41 and absorbs heat at the outdoor heat exchanger 30.

In this case, when the refrigerant and cooling water exchange heat with each other through the integrated heat exchanger 90, the third expansion valve 43 is operated for expansion. Accordingly, evaporation is generated at the integrated heat exchanger so the cooling water 90, circulating through the cooling water lines can be cooled through heat exchange.

It is shown in FIG. 6 that the temperatures of the PE part 60 and the battery 70 are adjusted using the integrated heat exchanger 90.

Meanwhile, as shown in FIG. 7, in order to implement a heat pumping process via heat absorption of the PE part 60 or the battery 7, the first expansion valve 41 is operated for expansion, the second expansion valve 42 is closed, and the third expansion valve 43 is opened, and the controller C controls the switch valve V3 such that the refrigerant that has passed through the compressor 10, the indoor heat exchanger 20, and the first expansion valve 41 absorbs heat through the outdoor heat exchanger 30 and the integrated heat exchanger 90 and then circulates to the compressor 10 in the refrigerant circuit 100.

In other words, in order to cool cooling water using the integrated heat exchanger 90, the first expansion valve 41 is operated for expansion, the second expansion valve 42 is closed, and the third expansion valve 43 is opened, so the refrigerant discharged from the compressor 10 condenses through the indoor heat exchanger 20 and is then expanded by the first expansion valve 41, whereby the refrigerant absorbs heat at the outdoor heat exchanger 30 and the integrated heat exchanger 90.

In this configuration, when it is required to heat the PE part 60, the first port 1 and the second port 2 of the first valve V1 are opened and the third port 3 thereof is closed, whereby it is possible to circulate cooling water to the PE part 60 and the integrated heat exchanger 90. Further, when it is required to heat the battery 70, the fourth port 4 and the fifth port 5 of the second valve V2 are opened and the sixth port 6 thereof is closed, whereby it is possible to circulate cooling water to the battery 70 and the integrated heat exchanger 90.

Meanwhile, as shown in FIG. 8, in order to perform dehumidification, the first expansion valve 41 is closed and the second expansion valve 42 is operated for expansion, and the controller C controls the switch valve V3 and the third expansion valve 43 such that the refrigerant flows through the compressor 10, the indoor heat exchanger 20, the second expansion valve 42, and the evaporator 50 in the refrigerant circuit 100.

In other words, when it is required to dehumidify an interior, the controller C controls the switch valve V3 and the third expansion valve 43 such that the refrigerant flows through the compressor 10, the indoor heat exchanger 20, the third expansion valve 43, the second expansion valve 42, and the evaporator 50 in the refrigerant circuit 100. In this case, since the second expansion valve 42 is operated for expansion, heat absorption is generated at the evaporator 50, whereby dehumidification air can be produced and the temperature of conditioning air can be adjusted by adjusting the position of the temperature adjustment door D.

Meanwhile, as shown in FIG. 9, in order to implement a heat pumping process via external air heat absorption during interior dehumidification, the first expansion valve 41 is operated for expansion and the second expansion valve 42 is opened, and the controller C controls the switch valve V3 such that the refrigerant flows through the compressor 10, the indoor heat exchanger 20, the first expansion valve 41, the outdoor heat exchanger 30, and the evaporator 50 in the refrigerant circuit 100.

When it is required to perform both interior dehumidification and heat pumping, the first expansion valve 41 is operated for expansion, the second expansion valve is opened, and the switch valve V3 is controlled such that the refrigerant discharged from the compressor 10 condenses through the indoor heat exchanger 20, is expanded by the first expansion valve 41, and absorbs heat at the outdoor heat exchanger 30. Further, since the refrigerant expanding through the first expansion valve 41 is supplied also to the evaporator 50, evaporation is generated at the evaporator 50, whereby dehumidification air can be produced.

Further, in order to send the refrigerant to the integrated heat exchanger 90 by controlling the switch valve V3, cooling water circulating through the first cooling water line 201 or the second cooling water line 202 and the refrigerant can be cooled through heat exchange at the integrated heat exchanger 90. Accordingly, it is possible to simultaneously perform interior dehumidification and heat pumping.

As described above, the present disclosure can efficiently cool the PE part 60 and the battery 70 using the radiator 80 and the integrated heat exchanger 90.

In other words, as shown in FIG. 10, since the temperature increase inclination of the battery 70 is gentle when a mobility device is being driven, the radiator 80 is used to cool the PE part 60, and the radiator 80 is used to cool the battery 70 when it is required to cool the battery 70. Thereafter, when the temperature of the battery 70 becomes stable, the radiator 80 may be used to cool the PE part 60.

Accordingly, the temperatures of the PE part 60 and the battery 70 can be stabilized through one radiator 80.

Meanwhile, as shown in FIG. 11, when the temperature of external air is high, quick charge is performed, or a mobility device (e.g., a vehicle) is being driven at a high speed, the refrigerant and cooling water exchange heat with each other through the integrated heat exchanger 90 such that the temperatures of the PE part 60 and the battery 70 are managed.

For example, when a mobility device is being driven after quick charge, the radiator 80 is used to cool the battery 70, and when it is required to decrease the temperature of the PE part 60, the radiator 80 is used to cool the PE part 60 and the integrated heat exchanger 90 is used to cool the battery 70. Thereafter, the PE part 60 is cooled by the radiator 80 when it is required to decrease the temperature of the battery 70, so temperature is stabilized, and accordingly, the radiator 80 is used to cool the battery 70. Further, when the temperature of the battery 70 becomes stable, the radiator 80 may be used to cool the PE part 60.

Accordingly, it is possible to manage the temperatures of the PE part 60 and the battery 70 using one radiator 80.

According to the integrated thermal management system having the structure described above, the entire area of the radiator 80 is used to cool the PE part 60 or the battery 70, so cooling performance is secured, the heat of the PE part 60 and the heat of the battery 70 are selectively shared, and a heat pumping process is implemented, whereby energy efficiency is improved and the entire circuit is implemented in a compact size.

Although the present disclosure was provided above in relation to specific embodiments shown in the drawings, it is apparent to those having ordinary skill in the art that the present disclosure may be changed and modified in various ways without departing from the scope of the present disclosure.

The invention claimed is:

1. An integrated thermal management system comprising:
   a refrigerant circuit including a compressor, an indoor heat exchanger, an outdoor heat exchanger, an expansion valve, and an evaporator, wherein a refrigerant circulates in the refrigerant circuit;
   a cooling water circuit including a first cooling water line including a power electronics (PE) part, a second cooling water line including a battery, and a third cooling water line connected to the first cooling water line and the second cooling water line and including a radiator, wherein cooling water circulate in the cooling water circuit;
   an integrated heat exchanger connected to the refrigerant circuit, the first cooling water line, and the second cooling water line such that the refrigerant and cooling water exchange heat with each other;
   a first valve disposed in the first cooling water line such that cooling water circulating to the PE part selectively flows to the radiator or the integrated heat exchanger; and
   a second valve disposed in the second cooling water line such that cooling water circulating to the battery selectively flows to the radiator or the integrated heat exchanger.

2. The integrated thermal management system of claim 1, wherein the cooling water circuit further includes a fourth cooling water line connected to the first cooling water line and the second cooling water line and including a reservoir.

3. The integrated thermal management system of claim 2, wherein a first water pump is disposed in the first cooling water line,
   a second water pump is disposed in the second cooling water line, and
   the fourth cooling water line is connected to a front end of the first water pump of the first cooling water line and a front end of the second water pump of the second cooling water line.

4. The integrated thermal management system of claim 1, wherein a front end of the third cooling water line is connected to a rear end of the PE part of the first cooling water line and a rear end of the integrated heat exchanger in the second cooling water line, and a rear end of the third cooling water line is connected to a front end of the first valve of the first cooling water line and a front end of the second valve of the second cooling water line.

5. The integrated thermal management system of claim 1, wherein the refrigerant circuit includes:
   a first refrigerant line including the compressor, the indoor heat exchanger, a first expansion valve, the outdoor heat exchanger, a second expansion valve, and the evaporator;
   a second refrigerant line diverging from a front end of the integrated heat exchanger of the first refrigerant line through a switch valve and connected to a front end of the compressor; and
   a third refrigerant line diverging through a third expansion valve between the switch valve of the second refrigerant line and the integrated heat exchanger and connected to the first refrigerant line.

6. The integrated thermal management system of claim 5, further comprising a controller configured to control the compressor and the valves in accordance with an air-conditioning mode and a thermal management mode.

7. The integrated thermal management system of claim 6, wherein the controller controls the first valve and the second valve such that cooling water circulates to the radiator through the first cooling water line and the third cooling water line in order to cool the PE part and such that cooling water circulates to the integrated heat exchanger in the first cooling water line in order to increase and maintain temperature of the PE part.

8. The integrated thermal management system of claim 6, wherein the controller controls the first valve and the second valve such that cooling water circulates to the radiator through the second cooling water line and the third cooling water line in order to cool the battery and such that cooling water circulates to the battery in the second cooling water line in order to increase and maintain temperature of the battery.

9. The integrated thermal management system of claim 6, wherein the controller controls the first valve and the second valve such that cooling water that has passed through the PE part circulates to the battery in the first cooling water line and the second cooling water line in order to increase temperature of the battery using heat of the PE part.

10. The integrated thermal management system of claim 6, wherein the controller controls the first valve and the second valve such that cooling water that has passed through the battery circulates to the PE part in the first cooling water line and the second cooling water line in order to increase temperature of the PE part using heat of the battery.

11. The integrated thermal management system of claim 6, wherein, in order to implement interior cooling or heat pumping, the second expansion valve and the third expansion valve are operated for expansion and the controller controls the switch valve and the third expansion valve such that the refrigerant, which has passed through the compressor, the indoor heat exchanger, the first expansion valve, and the outdoor heat exchange valve, circulates to the evaporator and the integrated heat exchanger in the refrigerant circuit.

12. The integrated thermal management system of claim 6, wherein, in order to implement interior heating or heat pumping via external air heat absorption, the first expansion valve is operated for expansion, the second expansion valve is closed, and the controller controls the switch valve such that the refrigerant, which has passed through the compressor, the indoor heat exchanger, and the first expansion valve, absorbs heat through the outdoor heat exchanger and then circulates to the compressor in the refrigerant circuit.

13. The integrated thermal management system of claim 6, wherein, in order to implement heat pumping via heat absorption of the PE part or the battery, the first expansion valve is operated for expansion, the second expansion valve is closed, the third expansion valve is opened, and the controller controls the switch valve such that the refrigerant, which has passed through the compressor, the indoor heat exchanger, and the first expansion valve, absorbs heat through the outdoor heat exchanger and the integrated heat exchanger and then circulates to the compressor in the refrigerant circuit, and controls the first valve or the second valve such that cooling water circulates to the integrated heat exchanger in the first cooling water line or the second cooling water line.

14. The integrated thermal management system of claim 6, wherein, in order to implement dehumidification, the first expansion valve is closed, the second expansion valve is operated for expansion, and the controller controls the switch valve and the third expansion valve such that the refrigerant flows to the compressor, the indoor heat exchanger, the second expansion valve, and the evaporator in the refrigerant circuit.

15. The integrated thermal management system of claim 6, wherein, in order to implement heat pumping via external air heat absorption during interior dehumidification, the first expansion valve is operated for expansion, the second expansion valve is opened, and the controller controls the switch valve such that the refrigerant flows to the compressor, the indoor heat exchanger, the first expansion valve, the outdoor heat exchanger, and the evaporator in the refrigerant circuit.

16. The integrated thermal management system of claim 1, wherein the radiator is configured such that an entire area thereof is an available area.

* * * * *